United States Patent
Elo

(10) Patent No.: US 6,748,076 B1
(45) Date of Patent: Jun. 8, 2004

(54) METHOD FOR SEPARATING NARROWBAND AND BROADBAND SERVICES ON A TRANSMISSION LINK AND A SPLITTER ELEMENT

(75) Inventor: Harri Elo, Helsinki (FI)

(73) Assignee: Nokia Corporation, Espoo (FI)

( * ) Notice: Subject to any disclaimer, the term of this patent is extended or adjusted under 35 U.S.C. 154(b) by 512 days.

(21) Appl. No.: 09/706,021

(22) Filed: Nov. 3, 2000

Related U.S. Application Data

(63) Continuation of application No. PCT/FI99/00510, filed on Jun. 10, 1999.

(30) Foreign Application Priority Data

Jun. 10, 1998 (FI) .................................................. 981319

(51) Int. Cl.$^7$ ........................... H04M 1/00; H04M 9/00
(52) U.S. Cl. ................. 379/402; 379/93.05; 379/93.09; 379/390.04; 370/463
(58) Field of Search .......................... 379/93.01, 93.05, 379/93.06, 345, 349, 360, 380, 386, 391, 399.01, 402, 413.02; 375/222, 229, 233; 370/463

(56) References Cited

U.S. PATENT DOCUMENTS

| | | | | |
|---|---|---|---|---|
| 4,595,803 | A | * 6/1986 | Wright | 370/282 |
| 5,533,048 | A | * 7/1996 | Dolan | 375/222 |
| 5,623,543 | A | 4/1997 | Cook | 379/402 |
| 5,627,501 | A | 5/1997 | Biran et al. | 333/17.1 |
| 6,212,263 | B1 | * 4/2001 | Sun et al. | 379/93.28 |
| 6,226,322 | B1 | * 5/2001 | Mukherjee | 375/229 |
| 6,519,255 | B1 | * 2/2003 | Graves | 370/392 |
| 6,542,540 | B1 | * 4/2003 | Leung et al. | 375/232 |
| 6,574,647 | B1 | * 6/2003 | Pfeiffer et al. | 708/300 |
| 6,621,346 | B1 | * 9/2003 | Nabicht et al. | 330/284 |

FOREIGN PATENT DOCUMENTS

| | | | |
|---|---|---|---|
| EP | 0795984 | 9/1997 | H04L/27/26 |
| EP | 0923221 | 6/1999 | |
| WO | WO 95/21488 | 8/1995 | H03H/11/04 |
| WO | WO 97/11534 | 3/1997 | H04B/3/50 |
| WO | WO 97/20396 | 6/1997 | |

OTHER PUBLICATIONS

John Cook and Phil Sheppard; "ADSL and VADSL Splitter Design and Telephony Performance", IEEE Journal on Selected Areas in Communications, vol. 13, No. 9, Dec. 1995, pp. 1634–1642.
International Search Report for PCT/FI99/00510.

* cited by examiner

*Primary Examiner*—Binh Tieu
(74) *Attorney, Agent, or Firm*—Squire, Sanders & Dempsey L.L.P.

(57) ABSTRACT

The invention relates to the separation of narrowband and broadband services in a telecommunications network. Signals belonging to a narrowband service are transferred in a first frequency range below a given threshold frequency and signals belonging to a broadband service are transferred in a second frequency range above said threshold frequency in the transmission link. The transmission link utilizes a splitter element comprising a low-pass filter unit and a high-pass filter unit, signals relating to narrowband service being separated to their dedicated interface by the low-pass filter unit and signals relating to broadband service being separated to their dedicated interface by the high-pass filter unit. In order that high-quality service may be offered to subscribers by means of a splitter element as simple and cost-effective as possible, filtering is implemented in the low-pass filter unit by means of a bidirectional active filter (LPF').

7 Claims, 3 Drawing Sheets

METHOD FOR SEPARATING NARROWBAND AND BROADBAND SERVICES ON A TRANSMISSION LINK AND A SPLITTER ELEMENT

This is a continuation of Application No. PCT/FI99/00510, filed Jun. 10, 1999.

FIELD OF THE INVENTION

The present invention relates generally to the implementation of a transmission link via which both narrowband and broadband services are offered. More specifically, the invention relates to the separation of narrow-band POTS/ISDN services from broadband services, particularly broadband services implemented with ADSL (Asymmetrical Digital Subscriber Line) technology. Narrowband services in this context denote services offered in the frequency range below the ADSL band.

BACKGROUND OF THE INVENTION

Optical fibre is a self-evident choice as a transmission medium for a core network, since trunk connections usually require high transmission capacity, the transmission distances used are long, and ready routes are often available for cables. Also for subscriber connections (line between a local exchange and a subscriber) the situation is rapidly changing, since various services implemented with multimedia, requiring a high transmission rate, will be commonplace from the point of an individual consumer as well.

However, no significant savings in the costs for constructing a future network offering broadband services can be foreseen, since the costs mainly arise from cable installation costs. However, it is desired to construct optical fibre also in the subscriber network as much as possible, since it is clearly seen that there will be a demand for it in the future. The costs of renewing subscriber networks are very high, however, and in terms of time decades are in fact at issue in this context. High costs are indeed the principal impediment to the spreading of fibre to the subscriber network.

On account of the above reasons, the possibilities of utilizing conventional subscriber line (metal pair cable) for fast data transmission, i.e. for rates clearly above the rate of an ISDN basic access (144 kbit/s), have been mapped out more effectively than before. The present ADSL (Asymmetrical Digital Subscriber Line) and HDSL (High bit rate Digital Subscriber Line) techniques do offer new possibilities for transfer of fast data and video along the pair cable of a telephone network to subscriber terminals.

An ADSL transmission link is asymmetric in the sense that the transmission rate from network to subscriber is much higher than from subscriber to network. ADSL technology is mainly intended for various on-demand services. In practice, the rate of an ADSL transmission link from network to subscriber is in the order 2–6 Mbit/s and from subscriber to network in the order 32–640 kbit/s (mere control channel). (The data rate of an ADSL line is always n×32 kbit/s, where n is an integer.)

The HDSL transmission technique relates to the transfer of a 2 Mbit/s-level digital signal in a metal pair cable. HDSL transmission is symmetric, that is, the transmission rate is the same in both directions.

Since the above solutions only afford rates in the order 1–6 Mbit/s, a technique enabling ATM-level rates (10–55 Mbit/s).has also been sought for the pair cable of a subscriber line. The international standardization body ETSI (European Telecommunications Standards Institute) is working out a specification on VDSL (Very high data rate Digital Subscriber Line) equipment enabling such rates. By VDSL technology, both symmetric and asymmetric links can be implemented.

The above technologies, by which fast data is transferred through a pair cable, are called by the common name xDSL. Thus, even though it is not yet possible to offer broadband services to end users by utilizing optical fibre, by means of these techniques the present telephone operators are capable of offering said services through existing subscriber lines.

Since ADSL seems at the moment to be the most promising technique for implementing broadband services, it will be used as an example of the access technique by means of which the services are offered.

The ADSL Forum has specified a generic network model for xDSL links; this is illustrated in FIG. 1. The device that connects to a subscriber line at the subscriber end is called ATU-R (ADSL Transmission Unit—Remote), and the device that connects to a subscriber line at the network end (e.g. at a local exchange) is called ATU-C (ADSL Transmission Unit—Central). These devices are also called ADSL modems (or ADSL transceivers), and they define between them an ADSL link. The high-speed data on the ADSL link is connected to the subscriber line in such a way that the subscriber can still use the old narrowband POTS/ISDN services, but the subscriber additionally has a high-speed data connection available. In principle, there are two ways to multiplex POTS and ADSL signals or ISDN and ADSL signals onto the same subscriber line: time division multiplexing or frequency division multiplexing. The present invention employs frequency division multiplexing, in which narrowband and broadband services are separated from one another by a splitter or cross-over carrying out the frequency division of ADSL signals and narrow-band signals. The splitter can be a POTS/ADSL splitter PS or an ISDN/ADSL splitter IS.

The terminals TE at the end user can be of many different types, such as terminals TE1 of a cable TV network, personal computers TE2 or even ISDN phones TE3 if time division multiplexing is used. A service module SMi (i=1 . . . 3) is provided for each terminal, carrying out the functions relating to terminal adaptation. Such service modules can in practice include Set Top Boxes, PC interfaces or LAN routers, for example. A premises distribution network PDN, located at the premises of the subscriber, connects the ATU-R to the service modules.

At the network end of the ADSL link, an access node AN constitutes a concentration point for narrowband and broadband data, at which point the traffic arriving from different service systems through different networks is concentrated. The access node is located at the exchange of a telephone network, for example.

In FIG. 1, reference A denotes the part constituted by a private network, B the part constituted by a public network, and C a network located at the premises of a subscriber (the telephones are naturally located at the subscriber).

The generic network model relating to xDSL links was set forth above in order to describe the overall environment of the invention. Since the invention relates to the part constituted by the actual ADSL link, which is located either between the local exchange and the subscriber or between a street cabinet and the subscriber, only this part located between the ADSL modems will be described in closer detail hereinbelow.

As stated previously, POTS (Plain Old Telephone Service) and ADSL services can be frequency multiplexed onto the same pair cable by means of a splitter. FIG. 2 illustrates a subscriber line divided between POTS and ADSL services, denoted with reference SL. In practice, the splitter (PS1 or PS2) comprises two filter units: a low-pass filter unit LPF prevents the access of signals of the ADSL band (25 kHz . . . 1, 1 MHz)to the POTS interface, and a high-pass filter unit HPF prevents the access of signals of the POTS band (0 Hz . . . 4 kHz) to the ADSL interface. Thus, the frequency division of the link is of the kind shown in FIG. 3: signals relating to POTS or ISDN services are transferred at low frequencies, and ADSL signals are transferred at higher frequencies. The splitter has a line port (P) connected to the subscriber line. The low-pass filter unit is connected between the line port and the POTS interface I1, and the high-pass filter unit HPF is connected between the line port and the ADSL interface I2.

Teleoperators determine the viability of filters by means of a reference impedance, which is defined so as to correspond to the actual impedance of the subscriber link as well as possible. FIG. 4 depicts a typical reference impedance Zref used by operators, comprising a resistance (R11) followed by a parallel connection of a resistance (R12) and a capacitor (C11). Some operators define the reference impedance as real (R11=C11=0), but in a generic case, however, the reference impedance is complex. The filter must provide a sufficiently good impedance match to the reference impedance in the voice band. A perfect impedance match is achieved when the output impedance of the generator concurs with the load impedance. The operators estimate the viability of filter units by feeding to a load impedance, being equal to the reference impedance, a signal from a generator whose output impedance also equals the reference impedance. The load impedance is looked at through the filter. In such a case, the effective load impedance deviates from the reference impedance, since the filter unit can never be entirely transparent. There is no international standard relating to the impedance match, but each operator has his own quantitative measure in determining what is a sufficiently good impedance match.

The impedance match of the splitter must be as good as possible in both directions, that is, too much reflection is not allowed in either direction. In practice, such a filter unit can be implemented as a passive LC network (i.e., as a circuitry comprising windings and capacitors). In the case of a high-pass filter, LC implementation seems to be the only feasible alternative. In the case of a low-pass filter, however, this implementation is attended by significant problems.

A passive low-pass filter loads both the subscriber line and the POTS interface by its input impedance. This impedance should equal the impedance of the subscriber line and the POTS interface as well as possible before the installation of the splitter, since in that case the splitter does not impair the matching of the POTS interface to the subscriber line. However, the impedance of a passive filter cannot be designed independently of the other parameters, but the transfer function striven for and the load impedance set the boundary conditions for the impedance to be realized.

Furthermore, sufficient isolation must be provided between the POTS and ADSL services. It has been found in practice that an insertion loss of at least 40 dB is needed in the low-pass filter to ensure that the services appear to the subscriber as fully isolated from one another. Such attenuation also meets the international requirements set on the maximum signal level outside the voice band, measured at a POTS interface. In the case of most operators, however, it is not possible to achieve a sufficiently good impedance match in such a situation. The resultant mismatch diminishes the trans-hybrid loss at the exchange end and sidetone masking at the subscriber end, thus deteriorating service quality.

It can be attempted to correct the impedance match for example in the manner disclosed in U.S. Pat. No. 5,623,543. This patent discloses a POTS splitter in which a passive filter is used as a low-pass filter; additionally blocks implemented with active electronics, wherewith the impedance match of the filter in the voice band is corrected, are used. However, such a solution renders the low-pass filter unit rather complex and expensive; for example a large number of transformers (6 in all), which are expensive components, are needed in such a solution. Furthermore, the solution requires a relatively high number of components (capacitors) resistant to a high ringing voltage (defined as 70 $V_{rms}$ (100 V peak-to-peak) in the international standards).

SUMMARY OF THE INVENTION

It is an object of the present invention to bring about an improvement to the above drawbacks by providing a solution enabling division of the same subscriber line in such a way that maximum service quality can be offered to subscribers as simply and economically as possible.

This object is achieved with a solution in accordance with the invention, which is defined in the independent claims.

The idea of the invention is to improve the impedance match by using bidirectional active low-pass filtering in the low-pass filter unit of the splitter.

Active low-pass filtering denotes a low-pass filter implemented with an operational amplifier as well as resistances and capacitors (no coils). The bidirectionality is implemented with two unidirectional filter blocks into which hybrid functions are incorporated for separating the different transmission directions to their dedicated filter blocks.

Bidirectional active filtering enables a very good impedance match and sufficient isolation of the services to be achieved simultaneously on the transmission link. Hence, narrowband and broadband service of a very high quality can be offered to subscribers.

BRIEF DESCRIPTION OF THE DRAWINGS

The invention and its preferred embodiments will be described in greater detail in the following with reference to examples in accordance with the accompanying drawings, in which.

DETAILED DESCRIPTION OF THE INVENTION

Figure 1:
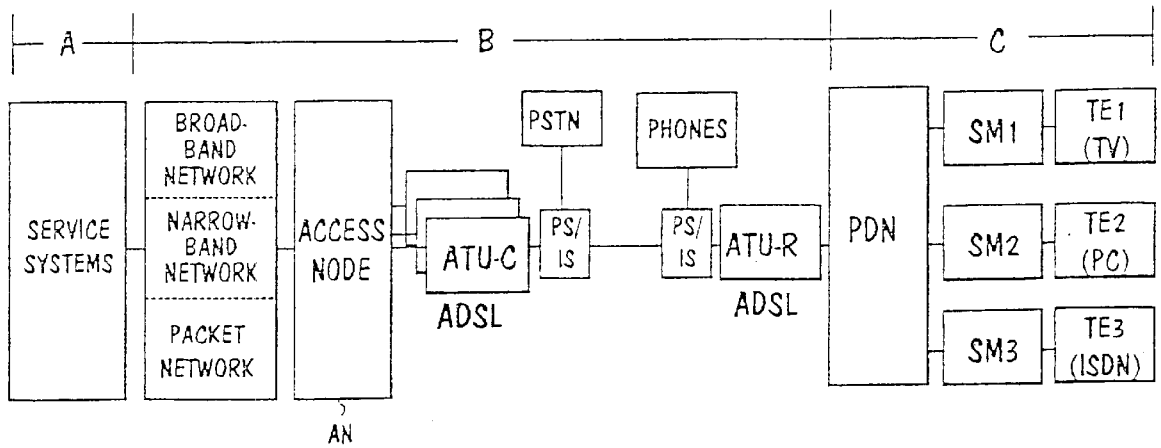
FIG. 1 illustrates the generic network model specified by the ADSL Forum.
Figure 2:
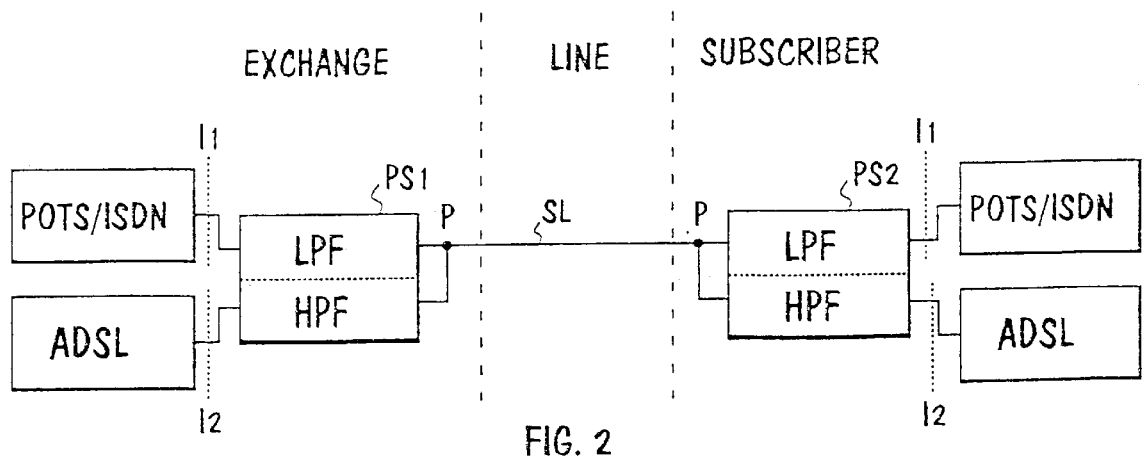
FIG. 2 shows a subscriber line divided between POTS and ADSL services.
Figure 3:
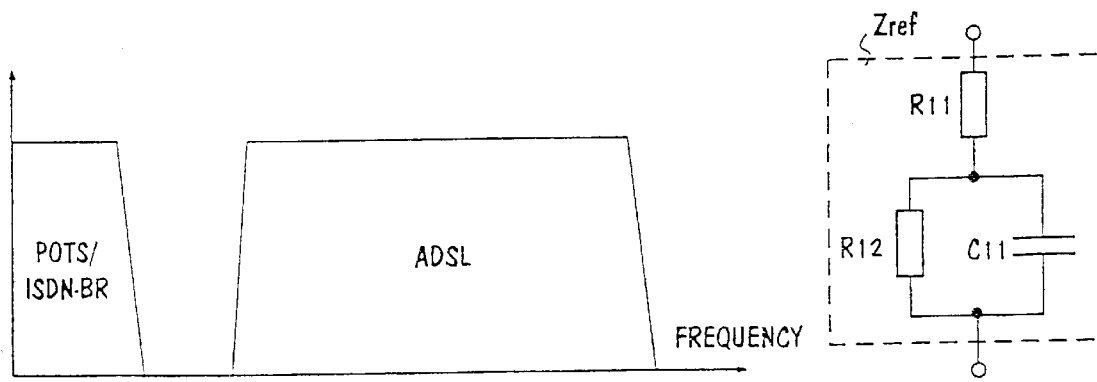
FIG. 3 shows the frequency division used on a transmission link in accordance with the invention.
Figure 4:
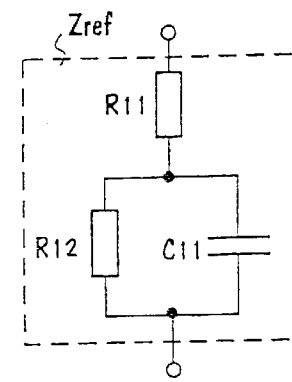
FIG. 4 illustrates the reference impedance used by operators, by means of which the viability of a splitter is estimated.
Figure 5:
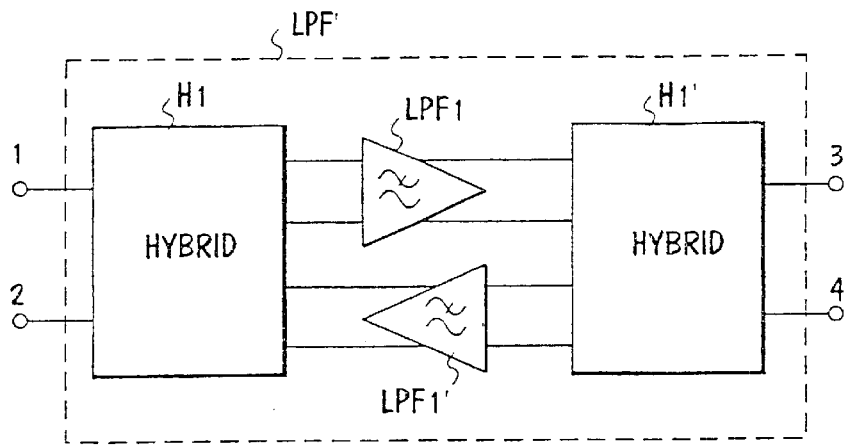
FIG. 5 shows a functional block diagram of a low-pass filter of a splitter in accordance with the invention.
Figure 6:
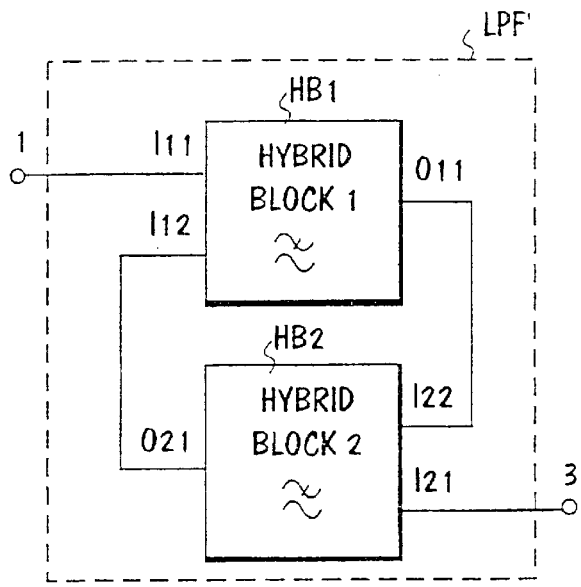
FIG. 6 is a structural block diagram of a low-pass filter of a splitter in accordance with the invention.

As stated previously, the low-pass filter of a splitter in accordance with the invention is implemented as an active filter the input and output impedance and transfer function of which can be designed independently of each other. In the general case, however, the active filter is unidirectional and is not suitable to be used in the splitter as such. In accordance with the invention, a reciprocal low-pass filter is implemented by using bidirectional active filtering in accordance with FIG. 5. The bidirectionality is implemented with two unidirectional filter blocks LPF1 and LPF1' as well as hybrids H1 and H1', separating the signals of the different transmission directions to their dedicated filter blocks and simultaneously preventing an echo from being generated. In FIG. 5, the low-pass filter is depicted as a logical level functional block diagram to illustrate the principle of the invention. Depicted in this manner, the low-pass filtering and two-wire/four-wire conversion are shown as separate functional blocks. In the functional sense, the low-pass filter unit thus comprises a hybrid and a filter block for each transmission direction. However, in practice the low-pass filter is implemented as shown in FIG. 6, in which one hybrid block (HB1 or HB2) realizes both low-pass filtering and hybrid facilities. In practice, the active filter LPF' is implemented as unipolar (the ground potential forming terminals 2 and 4 in FIG. 5), since the bipolar (differential) implementation of the active portion would require a double number of operational amplifiers. The input and output terminals of the hybrid blocks are denoted with references Iij and Oij, where i indicates which hybrid block (block 1 or block 2) is concerned, and j is the index of the port within the block. (It is to be noted that the terms input and output are used in this context only to distinguish the different sides from one another; the filter unit operates in the same way in both transmission directions.) The output terminal of the first hybrid block is connected to the second input terminal of the second hybrid block, and the output terminal of the second hybrid block is connected to the second input terminal of the first hybrid block respectively.

It is possible to implement a bidirectional active filter providing sufficient attenuation in the stop band (ADSL band) with a total of four operational amplifiers, since a total of two operational amplifiers is sufficient to implement unidirectional active filtering and the associated hybrid function. Such a connection implemented with four operational amplifiers will be described more closely in the following.

The active electronics used in the low-pass filter block cannot convey a ringing voltage through it (on account of the high amplitude of the ringing voltage). Therefore, in order for it to be possible to connect a filter LPF' as shown in FIGS. 5 and 6 to a subscriber line, a passage past the filter block must be created for the ringing voltage and direct current. Moreover, the filter must be isolated from the line so that there is no direct (galvanic) coupling between them.

Figure 7:
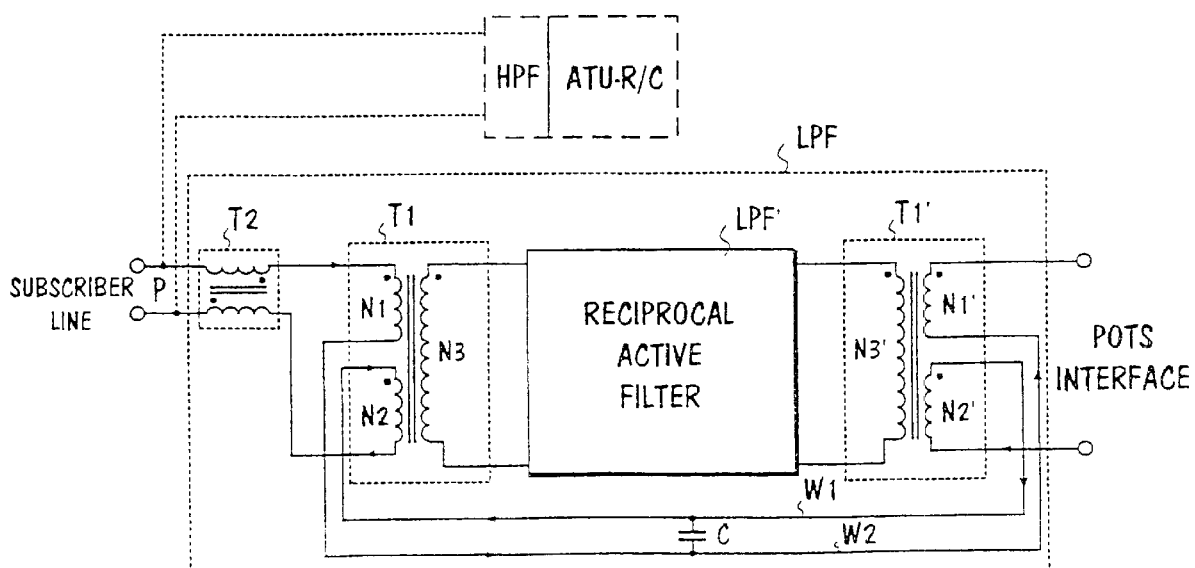
FIG. 7 illustrates the connection of an active filter in accordance with FIGS. 5 and 6 to a subscriber line.

FIG. 7 shows a topology meeting these conditions. In addition, the connection shown in the figure is still reciprocal. The opposite ends of the filter have similar transformers T1 and T1' The terminals of the secondary winding N3 of transformer T1 are connected to the input terminals of the filter, and the terminals of the secondary winding N3' of transformer T1' are connected to the output terminals of the filter. Even though the active filter has four terminals in the figure, it has two ports, as was stated above (the second terminals of windings N3 and N3' are in ground potential). Both transformers have two primary windings (N1 and N2 and N1' and N2' respectively), having the same number of turns. The first terminal of winding N1 is connected through the primary winding of transformer T2 to the first wire of the subscriber line, and the second terminal through wire W2 to the second terminal of winding N1' (the first terminal of each winding is the topmost terminal in the figure and the second terminal is the lowermost terminal in the figure). The first terminal of winding N1' forms the first terminal of the POTS interface. The second terminal of winding N2 is connected through the secondary winding of transformer T2 to the second wire of the subscriber line, and the first terminal through wire W1 to the first terminal of winding N2'. The second terminal of winding N2' forms the second terminal of the POTS interface. By means of the longitudinal transformer T2, the filter can be seen as a high impedance in the ADSL band. An overvoltage capacitor C is connected between wires W1 and W2, which must be capable of withstanding the amplitude of the ringing voltage. The figure denotes with an arrow the path of the DC signal which bypasses the filter. With the cooperation of (balanced) transformers T1 and T1', a symmetry (a conversion from unipolar to bipolar form) is created, so that the line appears symmetric seen from the subscriber line or the POTS interface.

Figure 8:
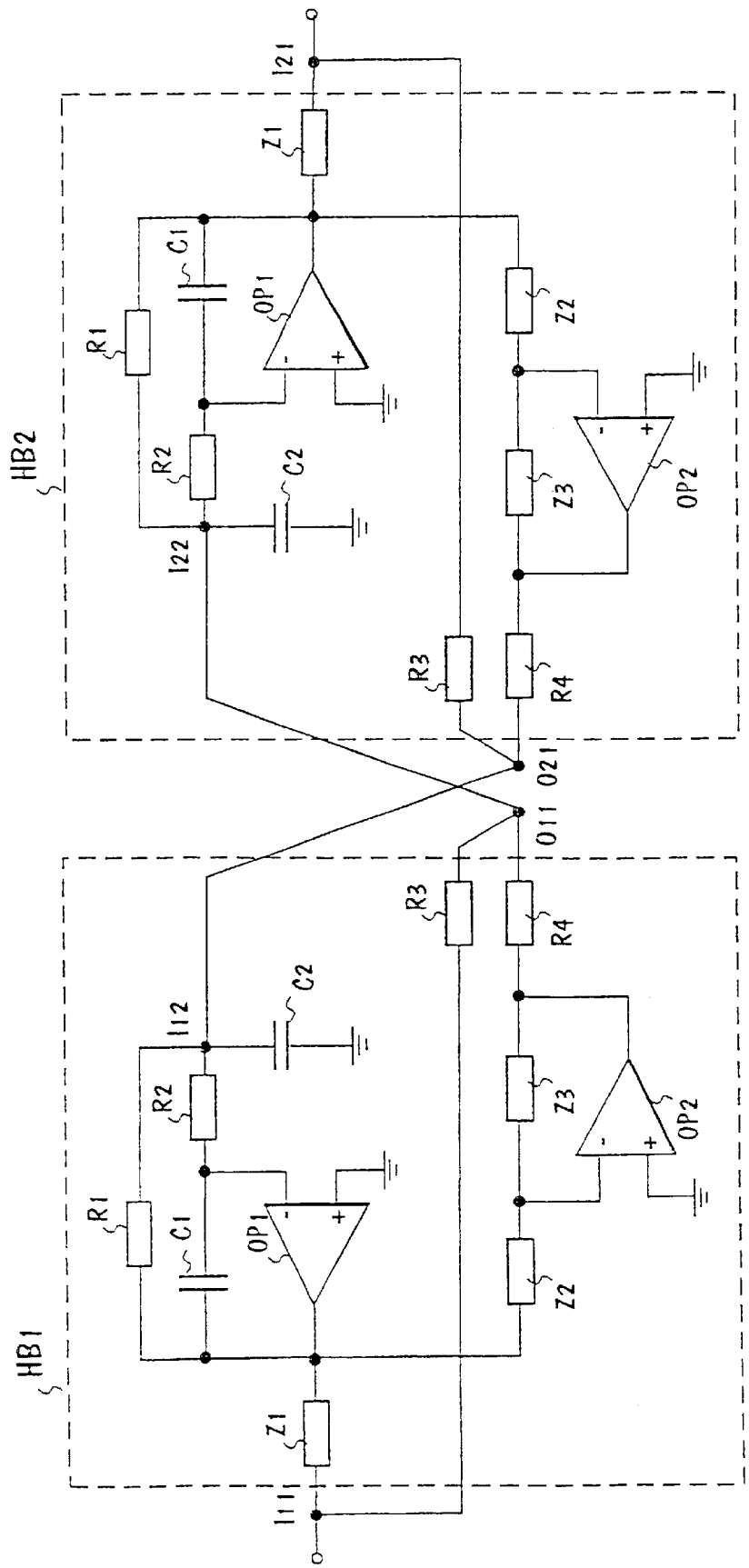
FIG. 8 illustrates a more detailed implementation of the active filter.

FIG. 8 shows in greater detail the reciprocal active filter LPF' of FIG. 6. The connection of the figure realizes a two-port connection, offering maximum match to the reference impedance Zref in the voice band. This means that (1) the input and output impedance of both ports must be as close to Zref as possible, and (2) the net amplification of the two-port connection must be as close to one as possible.

In FIG. 8, the same references have been used for the corresponding parts of the hybrid blocks HB1 and HB2. The low-pass filtering is performed by the operational amplifier OP1 with its ambient components. Operational amplifiers OP2 with their ambient components constitute part of the hybrid facility, but in practice both operational amplifiers of the hybrid block with their ambient components influence the hybrid function (separation of directions). Resistances are denoted with R and impedances with Z in the figure. The low-pass filter blocks (OP1 with its ambient components) are shown in the figure as the minimum implementation of a biquadratic active filter. The second input terminals I12 and I22 of the hybrid blocks, constituting the inputs of the low-pass blocks, are connected through capacitor C2 to ground and through resistance R2 to the inverted input of operational amplifier OP1. The non-inverted input of the operational amplifier for its part is connected to ground. The inverted input is connected to the output of the operational amplifier through capacitor C1, and additionally there is a feedback from the output to the input terminal (I12, I22) of the low-pass block through resistance R1. The output of the operational amplifier is connected through output impedance Z1 to the first input terminal (I11, I21) of the hybrid block, this again being connected to the output terminal (O11, O21) of the hybrid block through resistance R3.

Each hybrid block further comprises a second operational amplifier OP2 whose inverted input is connected through impedance Z2 to the output of the operational amplifier of the corresponding low-pass filter block. The non-inverted input of operational amplifier OP2 is connected to ground, and its output is connected by means of a feedback impedance Z3 to the inverted input of the operational amplifier. Furthermore, the output is connected through resistance R4 to the output terminal (O11, O21) of the hybrid block.

In the circuitry of FIG. 8, the impedance match and the two-wire/four-wire conversion are carried out substantially by means of three impedances: the output impedance Z1 of the low-pass filter block, the input impedance Z2 of the hybrid, and the feedback impedance Z3 of the hybrid.

The following is a brief description of the operation of the circuitry of FIG. 7. In an ideal situation, the inductances of the windings of the transformer T2 of FIG. 6 are very small, and additionally the inductances of the windings of transformers T1 and T1', and the capacitance of capacitor C are very high. In such a case, the current path formed by the primary sides of transformers T1 and T1', wires W1 and W2 as well as capacitor C substantially does not show in the voice or ADSL band, but the signals of said band are transferred from one interface to another by means of the active filter LPF'. Hence, a complete impedance match is achieved by selecting values for the impedances and resistances of FIG. 8 for example as follows: Z1=Z2=Zref and Z3=Zref/2 and R3=R4=(R1)/2>>|Zref| (where the vertical lines refer to the amplitude of Zref). With such a selection, also the hybrid performs its task perfectly (that is, separates the transmission directions from one another). This can be verified by Kirchoff's current and voltage equation.

In the circuitry shown in FIG. 8, the hybrid function (separation of directions) is achieved in such a way that in both hybrid blocks, a signal is generated at the output of operational amplifier OP2, having an equal amplitude but reverse phase compared to the signal over pin |11 and |21. In such a case, R3/R4/R1/OP1 constitute a (low-pass filtering) analog adder to whose output only the signal transferred in one direction is admitted: from the POTS interface to the subscriber line the power is transferred by means of resistances R3 and R4 of hybrid block HB2 and the operational amplifier OP1 and resistance R1 of hybrid block HB1, and from the subscriber line to the POTS interface the power is again transferred by means of resistances R3 and R4 of hybrid block HB1 and the operational amplifier OP1 and resistance R1 of hybrid block HB2. In the operational sense, the circuitry of FIG. 8 is thus in accordance with FIG. 5.

With direct current and ringing voltage on, the circuitry thus shows—in addition to the windings of transformer T2—only the windings of the primary sides of transformers T1 and T1' and additionally the overvoltage capacitor. The equivalent circuit of these is a short circuit in the ideal case. On the other hand, in the ADSL and voice band the equivalent circuit is constituted by transformers and the filter between them. If there is a sufficient attenuation in the filter, an open circuit can be considered as a first (rough) approximation of the connection.

In practice, transformer T2 must have an inductance deviating from zero, and transformers T1 and T1' must have a finite inductance and capacitor C a finite capacitance. These facts complicate the circuitry to such an extent that accurate estimation of the viability of the circuitry must be performed by a computer. However, it can be seen from such computation that the active filtering in accordance with the invention affords a very good impedance match, in practice to such an extent that it is impossible to achieve anything similar with a passive filter solution. Thus, the solution in accordance with the invention enables narrowband and broadband service of a very high quality to be offered to subscribers. Since the splitter can also be implemented more cost-effectively than heretofore, operators can offer these services to subscribers at more economic prices.

Even though the invention has been explained in the foregoing with reference to examples in accordance with the accompanying drawings, it is obvious that the invention is not restricted thereto, but it can be modified within the scope of the inventive idea set forth above and in the appended claims. For example, the detailed implementation of the active filter block can vary.

What is claimed is:

1. A method for separating narrowband and broadband services on a transmission link of a telecommunications network, the method comprising the steps of transferring signals belonging to a narrowband service in a first frequency range below a given threshold frequency and signals belonging to a broadband service in a second frequency range above said threshold frequency in the transmission link, utilizing a splitter element in the transmission link, the splitter element comprising a low-pass filter unit and a high-pass filter unit, signals relating to narrowband service being separated to their dedicated interface by the low-pass filter unit and signals relating to broadband service being separated to their dedicated interface by the high-pass filter unit, characterized by performing filtering in the low-pass filter unit by means of a bi-directional active filter.

2. A method as claimed in claim 1, wherein the active filtering is implemented as two unidirectional filter blocks to which a two-wire/four-wire conversion is combined for separating the signals of the different transmission directions to their dedicated filter blocks.

3. A splitter element in a telecommunications system for separating signals transferred in different frequency ranges, said splitter element comprising a line port (P) connected to a transmission link, a high-pass filter unit (HPF) connected to the interface of the line port and the interface for signals transferred in a higher frequency range, and a low-pass filter unit (LPF) connected to the interface of the line port and the interface for signals transferred in a lower frequency range, wherein the low-pass filter unit comprises a bi-directional active low-pass filter (LPF').

4. A splitter element as claimed in claim 3, wherein the low-pass filter comprises two unidirectional active filter blocks and hybrid means (H1, H1') for separating the signals of the different transmission directions to their dedicated filter blocks.

5. A splitter element as claimed in claim 4, wherein the filter block and the hybrid means comprise a total of four operational amplifiers, each filter block comprising one operational amplifier and the hybrid means in connection with each filter block comprising one operational amplifier.

6. A splitter element as claimed in claim 4, wherein the low-pass filter is connected through first transformer means to the line port and through the second transformer means to the interface for signals transferred in the lower frequency range.

7. A splitter element as claimed in claim 6, wherein the first transformer means comprise a first transformer (T1) having a first and second primary winding (N1, N2) and a secondary winding (N3) and a second transformer (T2) having a first primary winding (N1) being connected through said first winding to the first terminal of the line port and the second terminal of the second primary winding (N2) being connected through said second winding to the second terminal of the line port.

* * * * *